United States Patent [19]
Sata et al.

[11] Patent Number: 5,770,867
[45] Date of Patent: Jun. 23, 1998

[54] PHOTOCOUPLER DEVICE WITH LIGHT-TRANSMISSIVE RESIN INCLUDING FILLERS AND A PRODUCING PROCESS THEREOF

[75] Inventors: Naoki Sata, Kitakatsuragi-gun; Kazuo Kusuda, Shiki-gun, both of Japan

[73] Assignee: Sharp Kabushiki Kaisha, Osaka, Japan

[21] Appl. No.: 585,503

[22] Filed: Jan. 16, 1996

[30] Foreign Application Priority Data

Feb. 14, 1995 [JP] Japan ................................ 7-025176

[51] Int. Cl.⁶ ............................................. H01L 27/15
[52] U.S. Cl. .......................... 257/81; 257/82; 257/787; 257/789; 257/794
[58] Field of Search ........................... 257/80, 81, 82, 257/100, 787, 788, 789, 790, 795, 794

[56] References Cited

U.S. PATENT DOCUMENTS 4,412,135  10/1983  Awaji ................................. 250/551

FOREIGN PATENT DOCUMENTS

| | | | |
|---|---|---|---|
| 59-10762 | 4/1984 | Japan . | |
| 59-15391 | 4/1984 | Japan . | |
| 63-245968 | 10/1988 | Japan ........................... | 257/82 |
| 1-11355 | 1/1989 | Japan ........................... | 257/789 |
| 6-132427 | 5/1994 | Japan ........................... | 257/789 |

OTHER PUBLICATIONS

Patent Abstracts of Japan, vol. 17, No. 661 (E–1471), Dec. 7, 1993, JP 05 218493 A (Shapr Corp), Aug. 27, 1993.
Patent Abstracts of Japan, vol. 12, No. 293 (E–645), Aug. 10, 1988, JP 63 070445 A (Nitto Electric Ind Co Ltd), Mar. 30, 1988.
Patent Abstracts of Japan, vol. 10, No. 213 (E–422), Jul. 25, 1986, JP 61 051853 A (Mitsubishi Electric Corp), Mar. 14, 1986.
Patent Abstracts of Japan, vol. 17, No. 689 (C–1143), Dec. 16, 1993, JP 05 230178 A (Matsushita Electric Work Ltd), Sep. 7, 1993.

*Primary Examiner*—Jerome Jackson
*Assistant Examiner*—Nathan K. Kelley

[57] ABSTRACT

A photocoupler device includes a light-emitting chip, a light-receiving chip, a light-emitting side lead frame for individually holding the light emitting chip and a light-receiving side lead frame for individually holding the light-receiving chip. The light-emitting and light-receiving chips are opposed to each other so as to be optically coupled and covered with a light-transmissive resin as a first molding layer, in the whole part except in the outside connecting terminal portions of the two lead frames. The first molding layer is further covered with an opaque resin as a second molding layer. In such a photocoupler device, the light-transmissive resin is made to contain fillers in an amount of 80% by weight or more and directly cover the light-emitting chip, without needing silicone-resin coating for protecting the light-emitting chip.

8 Claims, 10 Drawing Sheets

(IF 50mA, 1000h)

(Ta=-40°C /IF 50mA, 1000h)

FILLER CONTENT : 86.5% (Ta=-40°C /IF=50mA, 1000h)

PHOTOCOUPLER DEVICE WITH LIGHT-TRANSMISSIVE RESIN INCLUDING FILLERS AND A PRODUCING PROCESS THEREOF

BACKGROUND OF THE INVENTION

1. Field of the Invention

The present invention relates to a photocoupler device composed of a pair of light-emitting and light-receiving chips which are opposed to each other so as to be optically coupled and packaged with a double-layered molding, and the invention relates to a process of producing the same.

2. Description of the Prior Art

A photocoupler device is to transmit a signal from a light-emitting element to a light-responsive element by coupling the pair of elements through light. Accordingly, the structure of the device requires that at least the light-transmitting portions are joined with a light-transmissive material and the thus formed coupler is covered with an opaque and water-impermeable material in order to block entrance of light and permeation of water.

In order to achieve this feature, a photocoupler of double-layered mold type has conventionally been proposed in, for example, U.S. Pat. No. 4,412,135. FIG. 1 is a vertical sectional view showing a conventional photocoupler device of this type. Specifically, the photocoupler device is an optically coupled device of two-layered mold type and includes a light-emitting chip 1, a light-receiving chip 2, a light-emitting side lead frame 3 for individually holding the light emitting chip 1 at its one end and a light-receiving side lead frame 4 for individually holding the light-receiving chip 2 at its one end. The light-emitting chip 1 is covered for protection by a pre-coating resin 5. The light-emitting and light-receiving chips 1 and 2 are opposed to each other so as to be optically coupled and covered with a light-transmissive resin 6 as a first molding layer, in the whole part except in the outside connecting terminal portions of the two lead frames 3 and 4. An opaque resin 7 for a second molding layer is provided over the light-transmissive resin 6.

The pre-coating resin 5 consists of, for example, silicone resin while the light-transmissive resin 6 and the opaque resin 7 are of, for example, epoxy resin.

Now, the producing process of the photocoupler device will be described with reference to a flowchart of producing steps shown in FIG. 2. In the chart, GL indicates an independent process for the light-emitting chip side while PT indicates an independent process for the light-receiving chip side.

At first, light-emitting and light-receiving chips 1 and 2 are separately die-bonded to respective lead frames 3 and 4, which are both made of metal and previously bent so as to allow the chips to be opposed to each other. The light-emitting chip 1 and the light-receiving chip 2 each are wire-bonded to a corresponding outside connecting terminal with gold wire 8.

Next, the light-emitting chip 1 is pre-coated with a transparent pre-coating resin 5 in order to relieve stress.

Thereafter, the light-emitting and light-receiving chips 1 and 2 are made to be opposed to each other by spot-welding, setting them in a loading frame or any other method and subjected to a first transfer molding operation of the light-transmissive resin 6 so that the chips are optically coupled. Then, after burrs are removed, the first molding is subjected to a second transfer molding operation of the opaque resin 7.

Then, the outside connecting terminal portions are plated with tin or solder and lead-formed. The thus produced products are subjected to various tests including the insulation test and the electric characteristic test and the appearance observation and packaged for shipping.

Next, FIG. 3 is a vertical sectional view showing another conventional photocoupler device.

This photocoupler device is an optically coupled device of single layered mold type and includes a light-emitting chip 1, a light-receiving chip 2, a light-emitting side lead frame 3 for individually-holding the light emitting chip 1 at its one end and a light-receiving side lead frame 4 for individually holding the light-receiving chip 2 at its one end. The light-emitting and light-receiving chips 1 and 2 are joined with a light-transmissive resin 9 so as to be opposed to each other and optically coupled. Then, an opaque resin 7 for a secondary molding layer is provided over the light-transmissive resin 9, in the whole part except in the outside connecting terminal portions of the two lead frames 3 and 4.

The light-transmissive resin 9 consists of, for example, silicone resin.

Hereinbelow, the producing process of the photocoupler device will be described with reference to a flowchart of producing steps shown in FIG. 4. In the chart, GL indicates an independent process for the light-emitting chip side while PT indicates an independent process for the light-receiving chip side.

At first, the light-emitting and light-receiving chips 1 and 2 are separately die-bonded to respective lead frames 3 and 4, which are both made of metal and previously bent so as to allow the chips to be opposed to each other. The light-emitting chip 1 and the light-receiving chip 2 each are wire-bonded to a corresponding outside connecting terminal with gold wire 8.

Thereafter, the light-emitting and light-receiving chips 1 and 2 are made to be opposed to each other by spot-welding, setting them in a loading frame or any other method and joined with the light-transmissive resin 9 so that these elements are optically coupled. Then, the resultant is subjected to a secondary molding operation of the opaque resin 7.

Then, the outside connecting terminal portions are plated with tin or solder and lead-formed. The thus produced products are subjected to various tests including the insulation test and the electric characteristic test and the appearance observation and packaged for shipping.

In recent years, of the above photocoupler devices, the photocoupler device of double-layered molding type shown in FIG. 1 has become predominantly used.

In general, the manufacturing process of the photocoupler devices of double-layered molding type, suffered a problem that if the light-transmissive resin 6 and the opaque resin 7 have different coefficients of expansion, are damped and subjected to heat-stress operations such as solder-dipping or reflow process, there is a possibility of occurrence of cracking in the light-transmissive resin 6.

In order to avoid this, in the prior art, fillers are mixed in the light-transmissive resin 6 in an amount of about 70% by weight so as to reduce the difference between the coefficients of linear expansion of the light-transmissive resin 6 and the opaque resin 7, to thereby prevent occurrence of cracks. As an example, the opaque resin 7 of epoxy resin has a coefficient of linear expansion of $2.0 \times 10^{-5}/°$ C. while the light-transmissive resin 6 with fillers has a coefficient of linear expansion of $2.24 \times 10^{-5}/°$ C. In this case, reducing the mixing amount of the fillers increases the coefficient of linear expansion of the resin 6.

When, as shown in FIG. 5, a current is flowed through the light-emitting chip 1 at a low-temperature range equal to or below $-20°$ C., the light-emitting chip 1 expands but the light-transmissive resin 6 shrinks, whereby stress generates in the corner portions of the light-emitting chip 1 and concentrates thereupon to markedly lower the output power of light emission from the light-emitting chip 1. This may cause a trouble or degrade the quality of the products.

In order to avoid the degradation of the light-emitting chip 1 due to the contraction of the light-transmissive resin 6, the light emitting chip 1 was pre-coated with the silicone resin 5 so as to alleviate the stress in the light-emitting chip 1.

Since the silicone resin 5 used in the conventional photocoupler device of double-layered molding type, however, is moisture permeable; if some moisture from the outside enters along the interfaces between the lead frames 3, 4 and the resin 7, 8 to reach the silicone resin 5, the moisture could reach the light-emitting chip 1 in an instance. As a result, the reliability of the light-emitting chip 1 cannot help exhibiting inferiority in its humidity-resistance to that of the light-receiving chip 4 which has no silicone resin 5.

To make matters worse, upon the pre-coating, the amount of the silicone resin 5 provided fluctuates more or less, so that precoat thickness of products vary. As a result, there is some difficulty to obtain the products with a stable CTR (current transfer ratio) characteristic.

Further, there is a demand and request of elimination of the pre-coating step of the silicone resin 5, in order to make the manufacturing process of the photocoupler device simple and continuous to thereby attain reduction of cost.

SUMMARY OF THE INVENTION

In view of the problems described above, it is therefore an object of the present invention to provide a photocoupler device in which a light-transmissive resin containing fillers in an amount of 80% by weight or more is used to mold essential elements, without needing silicone-resin coating for protecting its light-emitting chip.

A photocoupler device of a first aspect of the invention includes: a light-emitting chip; a light-receiving chip; a light-emitting side lead frame for individually holding the light emitting chip; a light-receiving side lead frame for individually holding the light-receiving chip; a light-transmissive resin as a first molding layer for covering the light-emitting and light-receiving chips opposed to each other so as to be optically coupled, and covering the chips and lead frames in the whole part except in the outside connecting terminal portions of the two lead frames; and an opaque resin as a second molding layer for covering over the first molding layer, is characterized in that the light-transmissive resin contains fillers in an amount of 80% by weight or more and directly covers the light-emitting chip.

A photocoupler device of a second aspect of the invention is characterized in that the aforementioned light-transmissive resin contains silicone and is silicone-modified.

A photocoupler device of a third aspect of the invention is characterized in that the aforementioned light-transmissive resin contains said silicone in an amount of 1 to 20% by weight.

A photocoupler device of a fourth aspect of the invention is characterized in that the content of fillers contained in the aforementioned light-transmissive resin ranges from 80% to about 95% by weight.

A photocoupler device of a fifth aspect of the invention is characterized in that the aforementioned light-transmissive resin contains silicone in an amount of 1 to 20% by weight and is silicone-modified while the content of fillers contained in the light-transmissive resin ranges from 80% to about 95% by weight.

A photocoupler device of a sixth aspect of the invention is characterized in that the aforementioned opaque resin is of epoxy resin.

In accordance with seventh aspect of the invention, a process of producing a photocoupler device, includes the steps of: arranging a light-emitting chip and a light-receiving chip in an opposing manner so as to be optically coupled, using an arbitrary means, both the chips being mounted individually in respective lead frames; covering the above arrangement in the whole part except in the outside connecting terminal portions of the two lead frames with a light-transmissive resin as a first molding layer, the light-transmissive resin containing the silicone in an amount of 1 to 20% by weight and being silicone-modified and the light-transmissive resin further containing fillers in an amount of ranging from 80% to about 95% by weight; and covering the first molding layer with an opaque resin forming a second molding layer.

In accordance with the configurations described above, since the photocoupler device of the invention has the light-transmissive resin containing fillers in an amount of 80% or more, the coefficient of linear expansion of the light-transmissive resin is made closer to that of the light-emitting chip as compared to the conventional configuration, to thereby reduce the stress of the resin upon the light-emitting chip. As a result, it becomes possible to use the light-transmissive resin to directly cover the light-emitting chip without needing the pre-coating of silicone resin which was needed in the conventional configuration.

In accordance with the photocoupler device of the invention, since the light-transmissive resin contains silicone and is silicone-modified, it is possible to reduce the stress which is generated when the light-transmissive resin shrinks and the light-emitting chip expands as current is applied at a low temperature and acted on the light-emitting chip. As a result, it is possible to reduce the degradation of the light-emitting chip.

DESCRIPTION OF THE PREFERRED EMBODIMENTS

Embodiments of the invention will hereinafter be described in detail with reference to the accompanying drawings.

Figure 6:
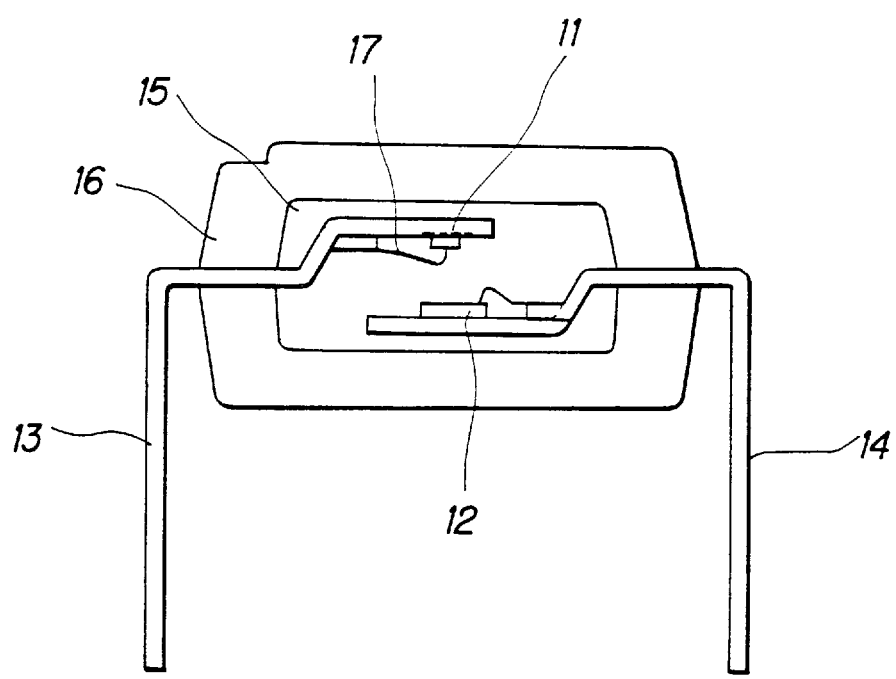
FIG. 6 is a vertical sectional view showing a photocoupler device in accordance with an embodiment of the invention.

Initially, FIG. 6 is a vertical sectional view showing a photocoupler device in accordance with an embodiment of the invention.

The photocoupler device is an optically coupled device of two-layered mold type and includes a light-emitting chip 11, a light-receiving chip 12, a light-emitting side lead frame 13 for individually holding the light emitting chip 11 at its one end and a light-receiving side lead frame 14 for individually holding the light-receiving chip 12 at its one end. The light-emitting and light-receiving chips 11 and 12 are opposed to each other so as to be optically coupled and covered with a light-transmissive resin 15 as a first molding layer, in the whole part except in the outside connecting terminal portions of the two lead frames 13 and 14. An opaque resin 16 for a second molding layer is provided over the light-transmissive resin 15.

The light-emitting chip 11 is composed of a typical light-emitting diode of a semiconductor comprising compound of elements in Group III–V, for example, gallium arsenide, while the light-receiving chip 12 is a typical silicon phototransistor.

Figure 7:
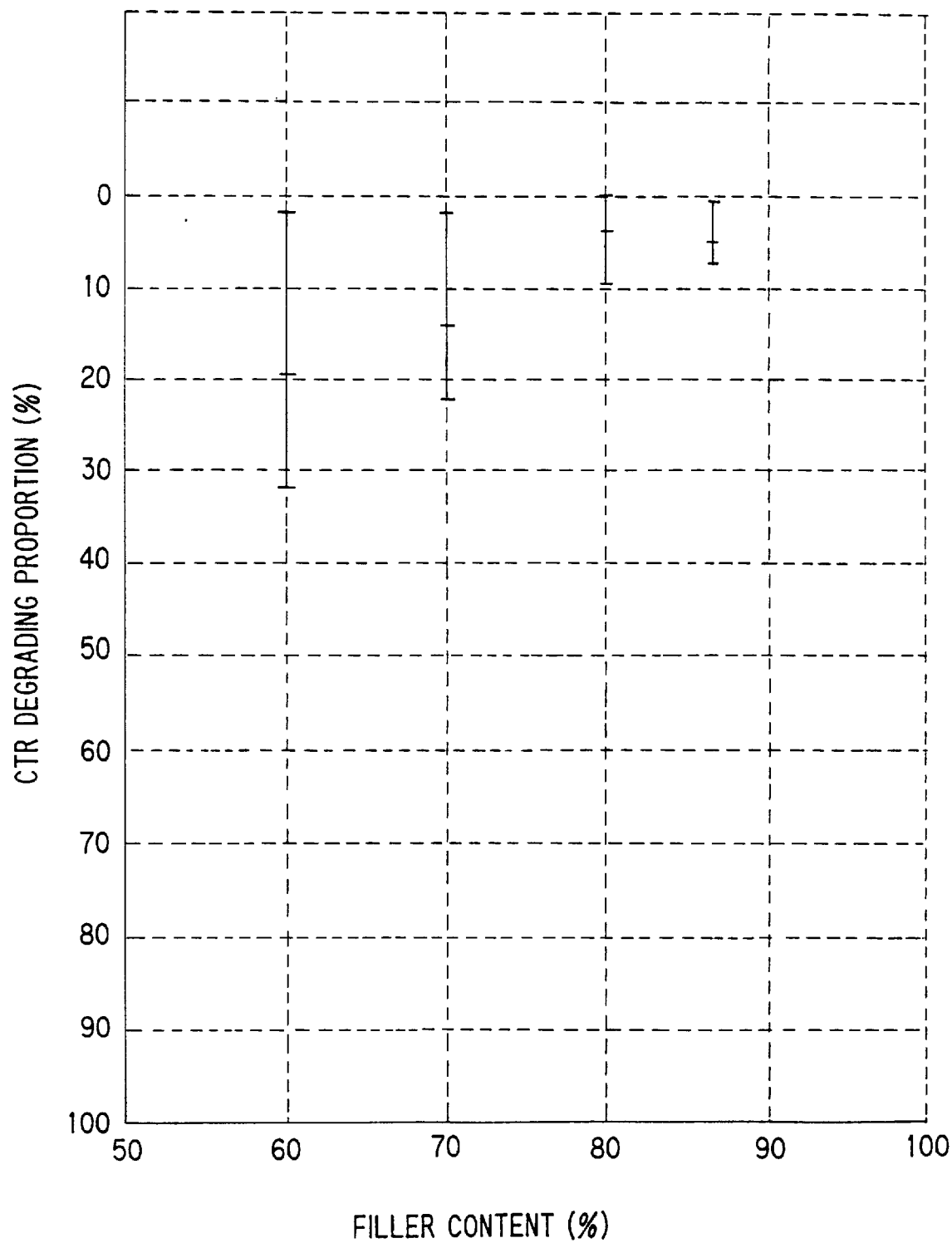
FIG. 7 is a plot showing a relation between content of fillers and CTR degrading proportion.

The light-transmissive resin 15 consists of a transparent epoxy resin containing fillers. As shown in FIG. 7, there is a relation as to the resin 15 between the filler content and the CTR (current transfer ratio) degrading proportion when current is applied to the device at a low temperature (−40° C.) to the resin 15. In order to regulate the CTR degrading proportion to a level (equal to or below 10%) within which the device can be put into practical use without any problem, the light-transmissive resin 15 contains the filler content of 80% by weight or more. In this case, in the temperature range of −40° C. or above, the CTR degrading proportion as well as its dispersion will be reduced as the temperature becomes higher.

In order to lower the stress generated by the epoxy resin itself, the light-transmissive resin 15 is silicone-modified, whereby the stress of the resin 15 acted onto the light-emitting chip 11 when the resin 15 shrinks in the low-temperature range is relieved. The content of the silicone is to be 1 to 20% by weight. This limitation particularly inhibits the degradation of the resin when current is applied at a low temperature (−40° C.).

Figure 8:
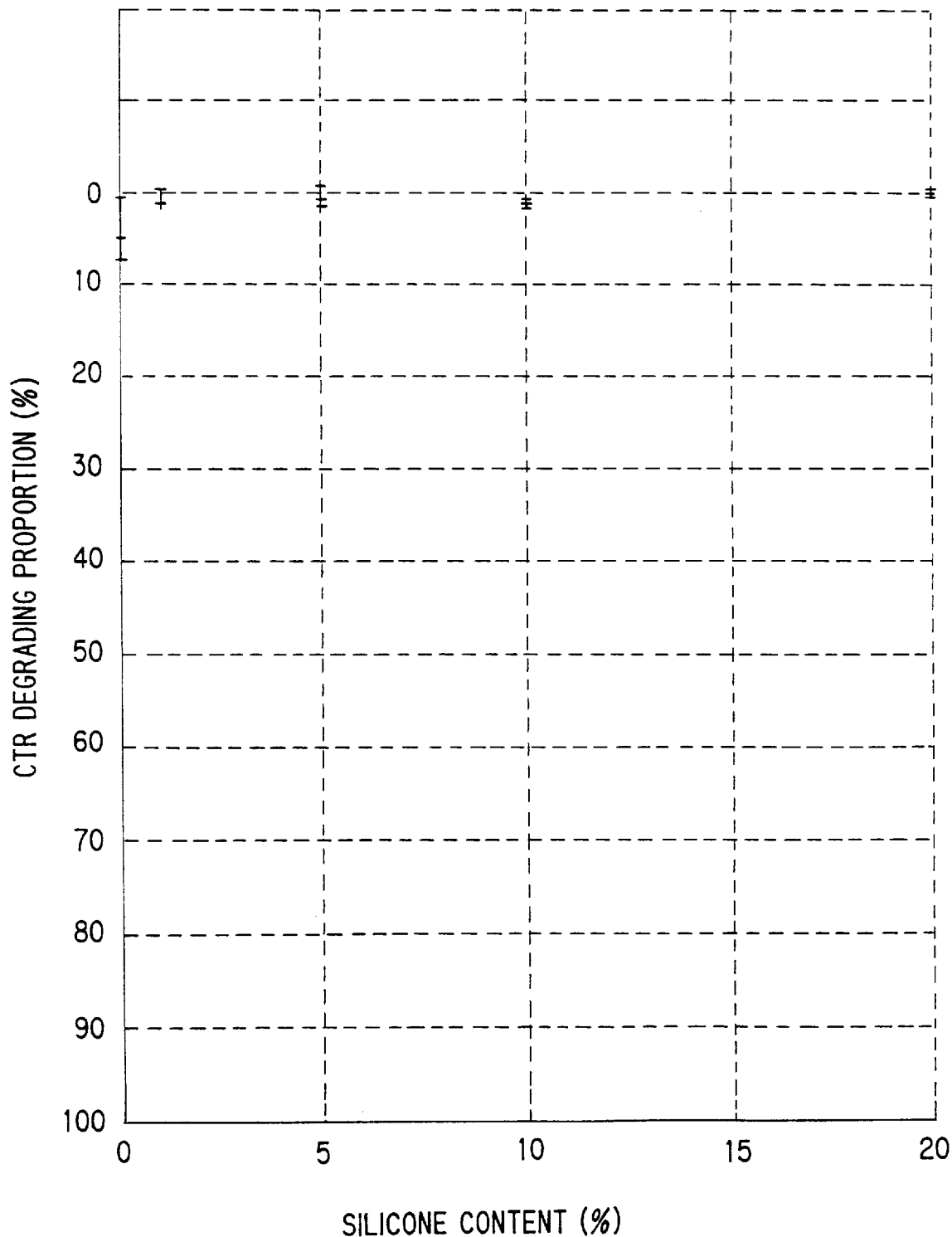
FIG. 8 is a plot showing a relation between content of silicone and CTR degrading proportion.

In this way, as fillers are added to the epoxy resin in an amount of 80% by weight or above and epoxy resin with the fillers is silicone-modified by adding silicone in an amount of 1 to 20% by weight, the CTR degradation can be inhibited equal to 5% or less when current is applied to the device at a low-temperature (−40° C.), as shown in FIG. 8. That is, this configuration is able to present equivalent performance to that of the conventional configuration in which pre-coating of silicone resin is done. FIG. 8 shows a case in which the resin contains the fillers in an amount of 86.5% by weight.

In the above case, the upper limit of the filler content on the basis of the light-transmissive resin may and should be up to about 95% by weight or less. Excessive containment of the fillers above this level is not practical in view of kneading of the fillers with the resin.

Figure 9A:
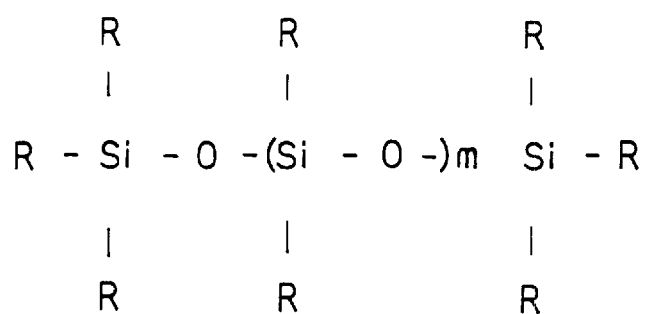
FIG. 9A is a chemical formula of a light-transmissive resin used in the embodiment of the invention.
Figure 9B:
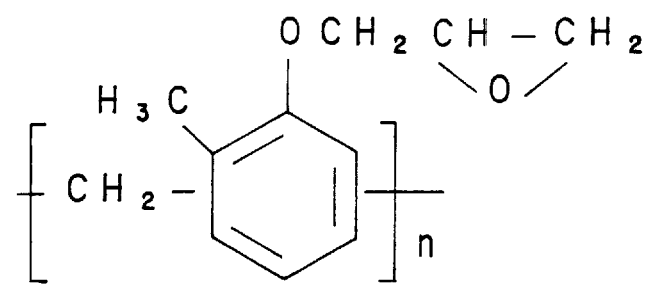
FIG. 9B is a chemical formula of a light-transmissive resin used in the conventional device.

FIG. 9A shows a chemical formula of a light-transmissive resin (for the resin 15 in FIG. 6) used in the embodiment of the invention. FIG. 9B shows a chemical formula of a light transmissive resin (for the resin 6 in FIG. 1) used in the conventional device. Epoxy resin, for instance, may be used as the opaque resin 16 in FIG. 6.

Figure 10:
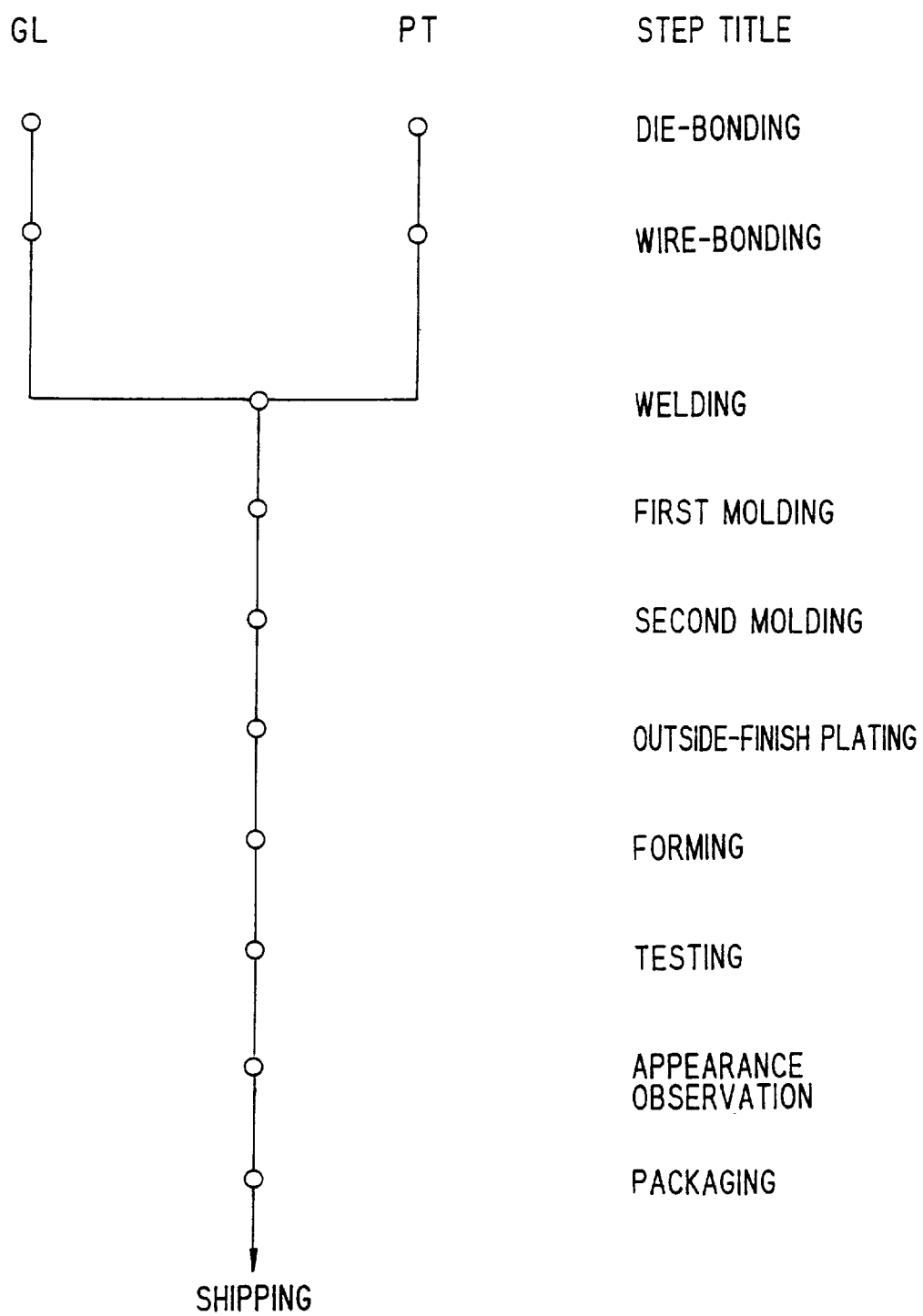
FIG. 10 is a flowchart of a producing process of the device shown in FIG. 6.

Now, the producing process of the photocoupler device will be described with reference to a flowchart of producing steps shown in FIG. 10. In the chart, GL indicates an independent process for the light-emitting chip side while PT indicates an independent process for the light-receiving chip side.

At first, light-emitting and light-receiving chips 11 and 12 are separately die-bonded to respective lead frames 13 and 14, which are both made of metal and previously bent so as to allow the chips to be opposed to each other. The light-emitting chip 11 and the light-receiving chip 12 each are wire-bonded to a corresponding outside connecting terminal with gold wire 17.

Thereafter, the light-emitting and light-receiving chips 11 and 12 are made to be opposed to each other by spot-welding, setting them in a loading frame or any other method and subjected to a first transfer molding operation of the light-transmissive resin 15 so that the chips are optically coupled. Then, after burrs are removed, the first molding is subjected to a second transfer molding operation of the opaque resin 16.

Then, the outside connecting terminal portions are plated with tin or solder and lead-formed. The thus produced products are subjected to various tests including the insulation test and the electric characteristic test and the appearance observation and packaged for shipping.

In this way, in accordance with the photocoupler device of this embodiment, since the light-transmissive resin 15 contains the fillers in an amount of 80% by weight or more, the light-transmissive resin 15 has a coefficient of linear expansion of $1.2 \times 10^{-5}/°$ C., which is closer to that of the light-emitting chip 11 ($0.6 \times 10^{-5}/°$ C.) than the conventional light-transmissive resin having a coefficient of liner expansion of $2.24 \times 10^{-5}/°$ C. Thus, the stress of the light-transmissive resin acted upon the light-emitting chip 11 is reduced, whereby it becomes possible to directly cover the light-emitting chip 11 with the light-transmissive resin 15 without needing the pre-coating of silicone resin which was needed in the conventional configuration.

Since the light-transmissive resin 15 is silicone-modified, it is possible to reduce the stress acted on the light-emitting chip 11 even when the light-transmissive resin 15 shrinks and the light-emitting chip 11 expands as current is applied at a low temperature. This makes it possible to reduce the degradation of the light-emitting chip 11.

Figure 1:
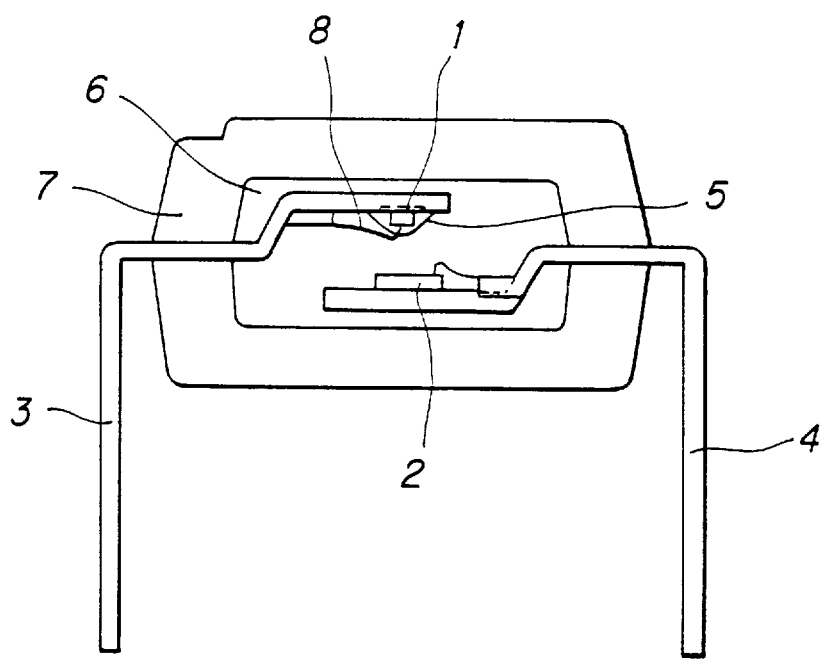
FIG. 1 is a vertical sectional view showing a conventional example of a photocoupler device.
Figure 2:
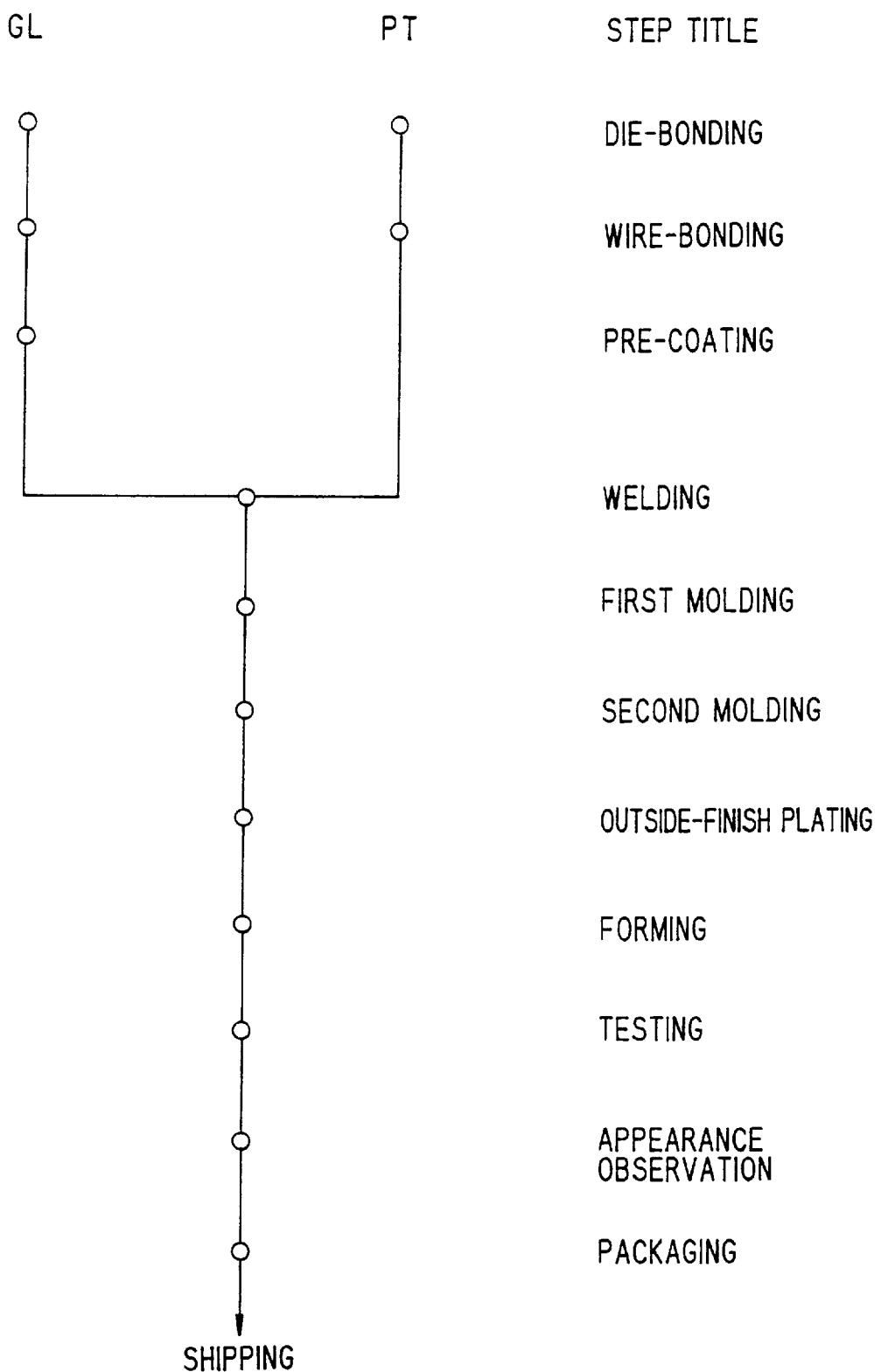
FIG. 2 is a flowchart of a producing process of the device shown in FIG. 1.
Figure 3:
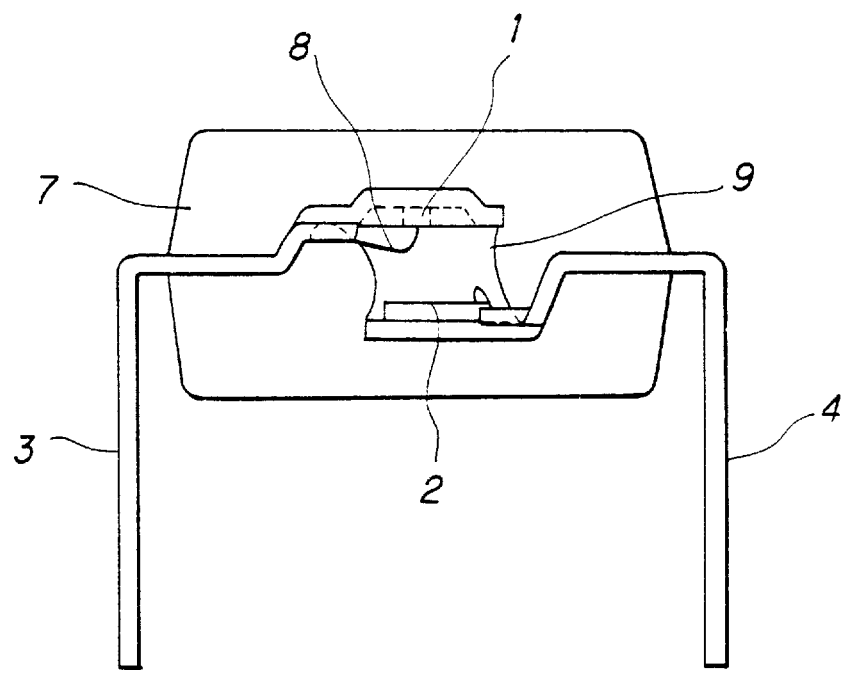
FIG. 3 is a vertical sectional view showing another conventional example of a photocoupler device.
Figure 4:
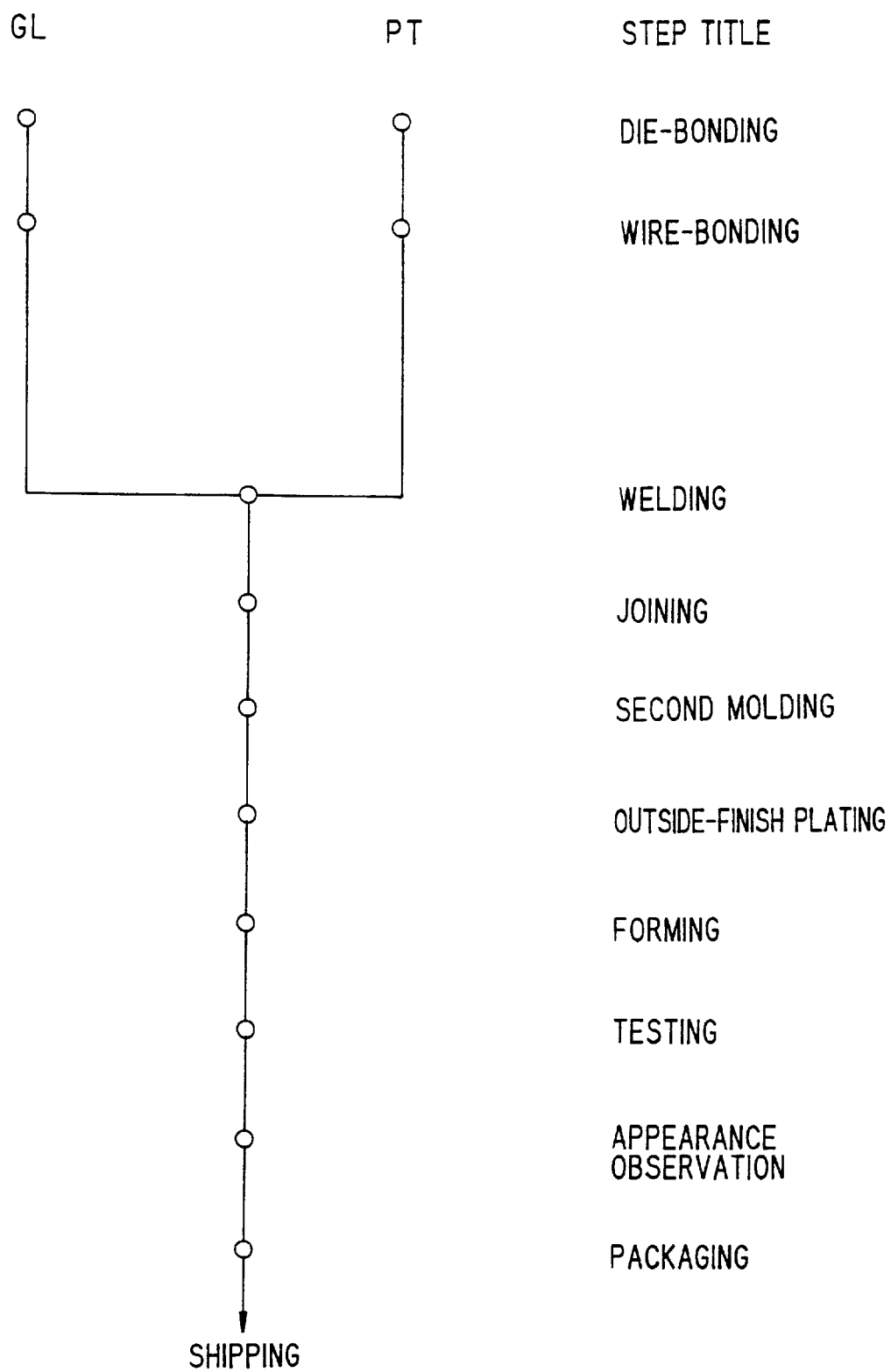
FIG. 4 is a flowchart of a producing process of the device shown in FIG. 3.
Figure 5:
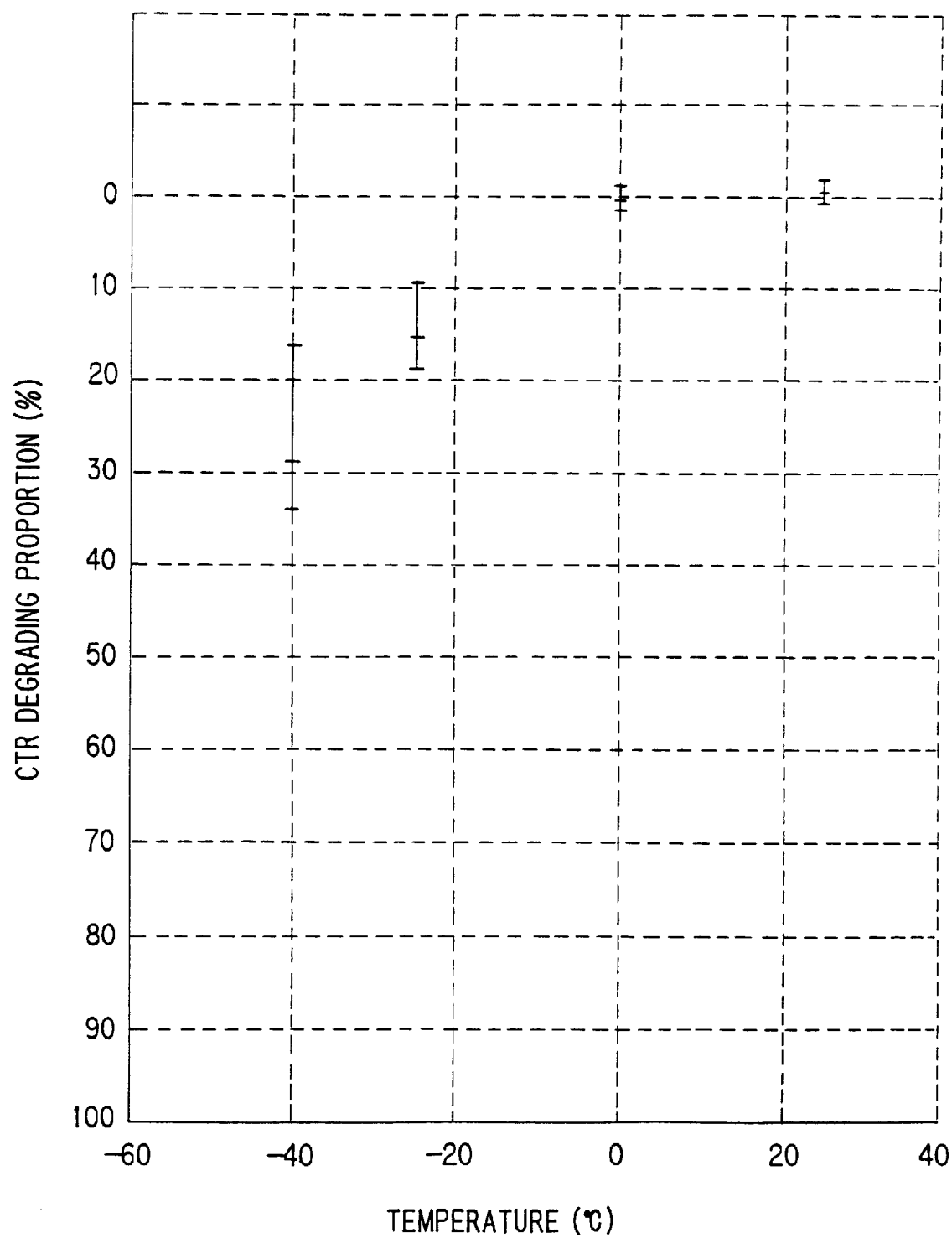
FIG. 5 is a plot showing a relation of temperature versus CTR degrading proportion.

By the above configuration, it is possible to provide a photocoupler device having substantially the same optical characteristic with that of the double-layered conventional photocoupler as shown in FIG. 1, except in that there is no pre-coating of silicone resin which is made in the conventional configuration.

Here, there is a fear that moisture might penetrate into the inside along the interfaces between the mold resins 17, 18 and the lead frames 13, 14 from the outside. In the photocoupler device of this embodiment, however, it takes a longer time for moisture to reach the light-emitting chip 11 for the absence of the pre-coating of silicone resin. As a result, this configuration is improved in humidity-resistance as compared to the conventional photocoupler of double-layered molding type and therefore is able to realize high reliability in its performance.

Further, it was difficult to obtain a stable CTR characteristic in the conventional configuration since the thickness of the pre-coating was varied due to the fluctuation of the supplied amount of pre-coating resin. The photocoupler device of this embodiment, however, has no pre-coating silicone resin layer, so that it is possible to provide photocoupler devices having stabilized CTR characteristics.

Moreover, since it is possible to omit the step for pre-coating in the manufacturing process, the process can easily be made continuous. Accordingly, it is possible to not only reduce the cost due to the reduction of the number of steps but also to develop the fabrication into an in-line process.

The present invention should not be limited to the above embodiment. Needless to say, the present invention can be applied to, for example, photo interrupters or resin-sealed semiconductor devices.

As described heretofore, in accordance with the photocoupler device of the invention, since the light-transmissive resin contains fillers in an amount of 80% by weight or more, the coefficient of linear expansion of the light-transmissive resin is made closer to that of the light-emitting chip as compared to the conventional configuration, to thereby reduce the stress of the resin upon the light-emitting chip. As a result, it becomes possible to use the light-transmissive resin to directly cover the light-emitting chip without needing the pre-coating of silicone resin which was needed in the conventional configuration. Accordingly, it is possible to simplify the manufacturing process as well as to obtain photocoupler devices having high humidity-resistance and stable CTR characteristics.

In accordance with the photocoupler device of the invention, since the light-transmissive resin contains silicone and is silicone-modified, it is possible to reduce the stress which is generated when the light-transmissive resin shrinks and the light-emitting chip expands as current is applied at a low temperature and acted on the light-emitting chip. As a result, it is possible to reduce the degradation of the light-emitting chip.

What is claimed is:

1. A photocoupler device comprising:
   a light-emitting chip;
   a light-receiving chip;
   a light-emitting side lead frame for individually holding said light emitting chip;
   a light-receiving side lead frame for individually holding said light-receiving chip;
   a light-transmissive resin as a first molding layer for covering said light-emitting and light-receiving chips opposed to each other so as to be optically coupled, said light-transmissive resin covering said chips and lead frames in the whole part except in the outside connecting terminal portions of said two lead frames; and
   an opaque resin as a second molding layer for covering over said first molding layer,
   wherein said light-transmissive resin contains fillers in an amount of 80% by weight or more and directly covers said light-emitting chip.

2. A photocoupler device according to claim 1 wherein said light-transmissive resin contains silicone and is silicone-modified.

3. A photocoupler device according to claim 2 wherein said light-transmissive resin contains said silicone in an amount of 1 to 20% by weight.

4. A photocoupler device according to claim 1 wherein the content of fillers contained in said light-transmissive resin ranges from 80% to about 95% by weight.

5. A photocoupler device according to claim 3 wherein said light-transmissive resin contains said silicone in an amount of 1 to 20% by weight and is silicone-modified while the content of fillers contained in said light-transmissive resin ranges from 80% to about 95% by weight.

6. A photocoupler device according to claim 1 wherein said opaque resin is of epoxy resin.

7. A process of producing a photocoupler device, comprising the steps of:
   arranging a light-emitting chip and a light-receiving chip in an opposing manner so as to be optically coupled, using an arbitrary means, both said chips being mounted individually in respective lead frames;
   covering said above arrangement in the whole part except in the outside connecting terminal portions of said two lead frames with a light-transmissive resin as a first molding layer, said light-transmissive resin containing said silicone in an amount of 1 to 20% by weight and being silicone-modified and said light-transmissive resin further containing fillers in an amount of ranging from 80% to about 95% by weight; and
   covering said first molding layer with an opaque resin forming a second molding layer.

8. A photocoupler device according to claim 4 wherein said light-transmissive resin contains said silicone in a amount of 1 to 20% by weight and is silicone-modified while the content of fillers contained in said light-transmissive resin ranges from 80% to about 95% by weight.

* * * * *